United States Patent
Shim

(10) Patent No.: US 7,518,931 B2
(45) Date of Patent: Apr. 14, 2009

(54) METHOD OF MONITORING AN ERASE THRESHOLD VOLTAGE DISTRIBUTION IN A NAND FLASH MEMORY DEVICE

(75) Inventor: Keon Soo Shim, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 56 days.

(21) Appl. No.: 11/850,660

(22) Filed: Sep. 5, 2007

(65) Prior Publication Data

US 2008/0055979 A1    Mar. 6, 2008

(30) Foreign Application Priority Data

Sep. 6, 2006   (KR) ...................... 10-2006-0085698
Jul. 26, 2007  (KR) ...................... 10-2007-0074943

(51) Int. Cl.
*G11C 11/34* (2006.01)
*G11C 16/04* (2006.01)
*G11C 16/06* (2006.01)

(52) U.S. Cl. ............................ 365/185.24; 365/185.02; 365/185.17; 365/185.18; 365/185.29

(58) Field of Classification Search ............ 365/185.02, 365/185.17, 185.18, 185.24, 185.29
See application file for complete search history.

(56) References Cited

U.S. PATENT DOCUMENTS

2008/0130360 A1*  6/2008  Kim ...................... 365/185.02

* cited by examiner

*Primary Examiner*—Ly D Pham
(74) *Attorney, Agent, or Firm*—Townsend and Townsend and Crew LLP

(57) ABSTRACT

A method monitors an erase threshold voltage distribution in a NAND flash memory device. The method programs a main cell by applying a first program voltage to the main cell, and then measures a threshold voltage of the main cell. The method programs a peripheral cell using a second program voltage and a third program voltage, and then measures a threshold voltage of the peripheral cell. The method measures a threshold voltage of the main cell changed by the measured threshold voltage of the peripheral cell, and then may predict an initial erase threshold voltage distribution of a page of the peripheral cell by using an interference correlation between the measured threshold voltages of the main cell and the peripheral cell.

14 Claims, 2 Drawing Sheets

METHOD OF MONITORING AN ERASE THRESHOLD VOLTAGE DISTRIBUTION IN A NAND FLASH MEMORY DEVICE

CROSS-REFERENCE TO RELATED APPLICATIONS

This application claims priority from Korean Patent Application No. 2006-85698, filed on Sep. 6, 2006 and Korean Patent Application No. 2007-74943, filed on Jul. 26, 2007, the contents of which are incorporated herein by reference in its entirety.

BACKGROUND OF THE INVENTION

The present invention relates to a method of monitoring an erase threshold voltage distribution in a NAND flash memory device. More particularly, the present invention relates to a method of monitoring an erase threshold voltage distribution in a NAND flash memory device for accurately measuring an erase threshold voltage distribution through an interference correlation between a peripheral cell and a main cell.

Recently, the demand has increased for a semiconductor memory device which electrically programs and erases data, and does not require a refresh function of periodically rewriting data.

In addition, a high integration technique of a memory cell has been developed for a mass storage memory device for storing a large amount of data. For example, a NAND flash memory where cells are connected in series to form a string for a highly integrated memory cell has been developed.

The NAND flash memory device controls a threshold voltage of the memory cell by injecting electrons into a floating gate of the memory cell or by emitting electrons in the floating gate by using an F-N tunneling method, thereby performing program and erase operations.

Since a multi-level cell in the NAND flash memory has a plurality of threshold voltage distribution conditions (unlike a single level cell), the multi-level cell should have an adequate read margin between threshold voltage distribution conditions.

Additionally, a shift phenomenon of the threshold voltage due to an interference effect of elements affecting the threshold voltage exists in the NAND flash memory device employing the floating gate. To reduce the shift phenomenon, a width of the threshold voltage distribution in each of the conditions is decreased. As a result, a maximum program threshold voltage is reduced. Accordingly, programming time is decreased due to the reduction of the maximum program threshold voltage, thereby enhancing program throughput.

However, the shift change of the threshold voltage due to the interference effect has a higher value as a quantity of change of a threshold voltage of a peripheral cell is increased. Thus, the quantity of change of the threshold voltage of the peripheral cell should be reduced as much as possible. Accordingly, there is a need to reduce the width of the threshold voltage of an erased cell. There is also a need to dispose a minimum erase threshold voltage next to a read line of the erased cell.

However, the threshold voltage of the erased cell has a negative value and the NAND flash memory device is activated by a positive bias. Thus, it is difficult to measure a negative threshold voltage value. On the other hand, it is possible to measure the threshold voltage having a negative value under negative bias conditions, but the size of a chip may be increased. Therefore, the NAND flash memory predicts the distribution of the negative threshold voltage value through an erase verifying operation performed at 0V after an erase operation.

Since it is difficult to accurately monitor the erase threshold voltage distribution, it is challenging to verify whether or not the erase threshold voltage distribution is improved through a process skew control. Furthermore, it is difficult to verify the erase threshold voltage distribution while performing a post program operation after erasing to improve the interference effect. Moreover, it is hard to verify a level of a threshold voltage of a program disturb tail bit.

SUMMARY OF THE INVENTION

It is a feature of the present invention to provide a method of monitoring an erase threshold voltage distribution in a NAND flash memory device for accurately measuring the erase threshold voltage distribution through an interference correlation between a peripheral cell and a main cell.

A method of monitoring an erase threshold voltage distribution in a NAND flash memory device according to one example embodiment of the present invention includes erasing a memory block; measuring a threshold voltage of a main cell by applying a first program voltage to the main cell; measuring a threshold voltage of the main cell changed by applying a second program voltage to a peripheral cell and a threshold voltage of the peripheral cell; measuring a threshold voltage of the main cell and a threshold voltage of the peripheral cell by applying a third program voltage to the peripheral cell; calculating an interference correlation between the second and third program voltages and the threshold voltages; and obtaining an erase distribution of the main cell and the peripheral cell using the interference correlation.

The first program voltage applied to a page of the peripheral cell has a value between approximately 15V and approximately 20V.

The method of claim further includes changing the second and third program voltages before calculating the interference correlation, and then measuring repeatedly threshold voltages of the main cell and the peripheral cell using the changed program voltages.

The threshold voltages of the main cell and the peripheral cell are repeatedly measured after changing two times or three times the program voltage The interference correlation is expressed as $Y=aX+b$, wherein X is an erase threshold voltage value of the peripheral cell; a is an interference coupling ratio; b is a threshold voltage of the main cell measured after the program operation is performed by using the first program voltage; and Y is a threshold voltage of the main cell changed by interference in accordance with the threshold voltage value of each of measured peripheral cells.

The erase distribution is expressed as $X'=(Y'-b)/a$, wherein X' is the erase threshold voltage value of the peripheral cell; and Y' is the changed threshold voltage value of the main cell.

The peripheral cell is adjacent to the main cell in a direction of a bit line or a direction of a word line.

As described above, an initial erase threshold voltage distribution is predicted using the interference correlation between a main cell and a peripheral cell.

It is possible to verify the level of a threshold voltage of a program disturb tail bit using the interference correlation between the main cell and the peripheral cell.

An advantageous erase condition may also be elicited in view of a maximum program condition and an interference effect.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings.

Figure 1:
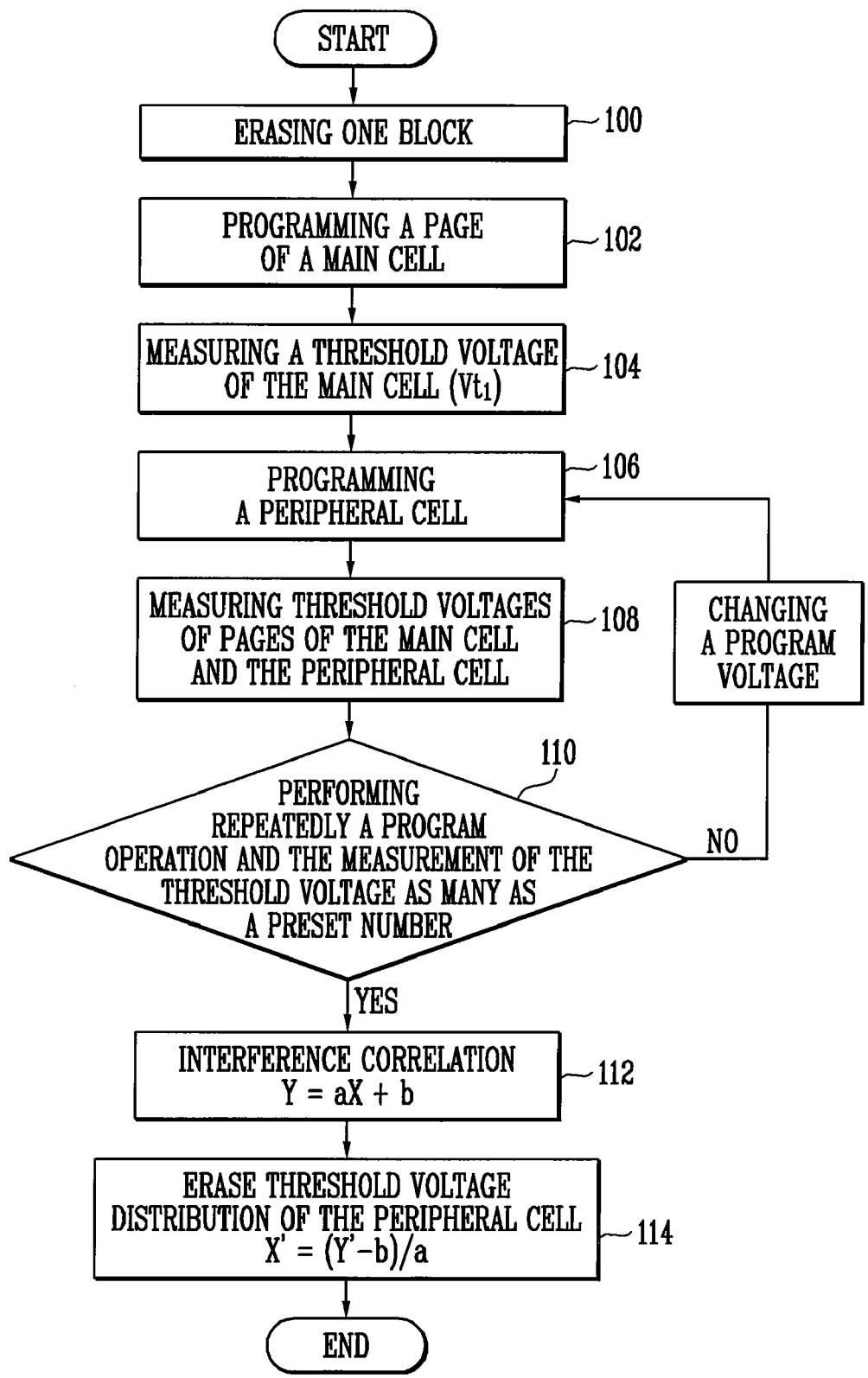
FIG. 1 is a flowchart illustrating a method of monitoring an erase threshold voltage distribution in a NAND flash memory device according to one example embodiment of the present invention.

FIG. 1 is a flowchart illustrating a method of monitoring an erase threshold voltage distribution in a NAND flash memory device according to one example embodiment of the present invention.

In FIG. 1, a memory block is erased by applying an erase voltage to the memory block in step S100.

In step S102, a program operation is performed by applying a first program voltage Vpgm1 to a main cell for measuring an erase threshold voltage.

In step S104, a program threshold voltage Vt1 of the main cell is measured after the program operation is performed.

In step S106, a program operation of a peripheral cell is performed by applying a second program voltage Vpgm2 to the peripheral cell. Here, the peripheral cell is a cell next to the main cell, e.g. in a direction of a bit line or in a direction of a word line.

In step S108, The threshold voltages of the main cell and the peripheral cell are measured.

A distribution of the threshold voltage Vt2 of the main cell is increased from the program threshold voltage Vt1 by an interference effect when the program operation of the peripheral cell is performed. In this case, the second program voltage Vpgm2 applied to the peripheral cell is approximately 15V to 20V. This is for controlling the changed threshold voltage value to have a read voltage smaller than a voltage applied in a read operation.

Subsequently, the above method of measuring the threshold voltage is again performed by using a third program voltage Vpgm3 instead of the program voltage Vpgm2 applied to the peripheral cell, thereby measuring a threshold voltage Vt3 of the main cell and a threshold voltage of the peripheral cell. Here, the third program voltage Vpgm3 is approximately 15V to 20V. This is for controlling the changed threshold voltage value to have a voltage smaller than the read voltage applied in the read operation. In one embodiment, the third program voltage Vpgm3 may be higher or smaller than the second program voltage Vpgm2.

In above description, two program operations are performed on the peripheral cell to measure the interference effect of the main cell, but the method of measuring the threshold voltage is not limited to two program operations. It is desirable to perform at least three program operations for measuring more accurately the threshold voltage value, wherein program voltages in the program operations have different values.

In step S112, an interference correlation between the peripheral cell and the main cell is calculated by using the threshold voltages Vt2 and Vt3 of the changed main cell and the initial threshold voltage Vt1 of the main cell. For example, the interference correlation is expressed below as Equation 1.

[Equation 1]

$Y = aX + b$, where "X" is an erase threshold voltage value of the peripheral cell; "a" is an interference coupling ratio expressed as a constant; "b" is the program threshold voltage Vt1 of the main cell after the program operation is performed by using the first program voltage Vpgm1; and "Y" is the threshold voltage Vt2 or Vt3 of the main cell changed by an interference in accordance with the threshold voltage value of each of measured peripheral cells.

Accordingly, an Equation about an initial erase threshold voltage distribution of a page of the peripheral cell is calculated, and then the erase threshold voltage of the page of the peripheral cell may be predicted by using the calculated Equation.

The erase threshold voltage of the peripheral cell corresponds to an initial program threshold voltage Vt1 of the main cell. The erase threshold voltage distribution is expressed below as Equation 2.

[Equation 2]

$X' = (Y' - b)/a$, where "X'" is the erase threshold voltage of the peripheral cell; and "Y'" indicates the changed threshold voltage Vt2 or Vt3 of the main cell.

Then, the program operation is finished.

Figure 2:
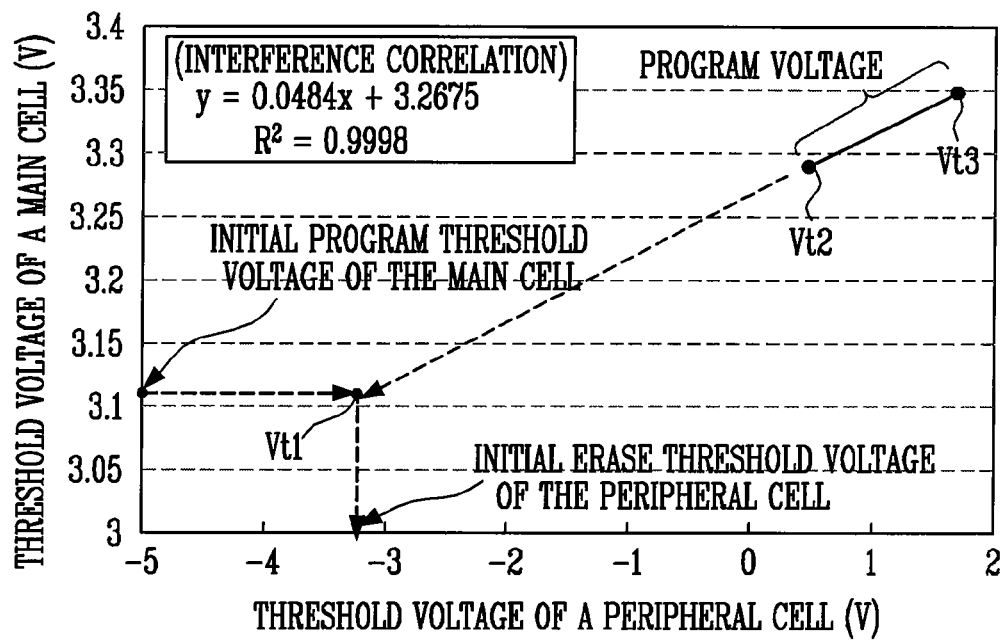
FIG. 2 is a view illustrating a graph of the interference correlation between the main cell and the peripheral cell using the threshold voltage measured in FIG. 1.

FIG. 2 is a view illustrating a graph of the interference correlation between the main cell and the peripheral cell using the threshold voltage measured in FIG. 1.

In FIG. 2, the graph shows the measured threshold voltage Vt2 or Vt3 of the main cell and the measured threshold voltage of the peripheral cell. Here, the threshold voltage of the peripheral cell is measured by applying a program voltage Vpgm2 or Vpgm3 to a page of the peripheral cell. The threshold voltage of the main cell changes in response to the measured threshold voltage of the peripheral cell.

The interference correlation is obtained using the measured threshold voltages illustrated in the graph. Accordingly, the initial erase threshold voltage of the peripheral cell may be predicted.

Figure 3:
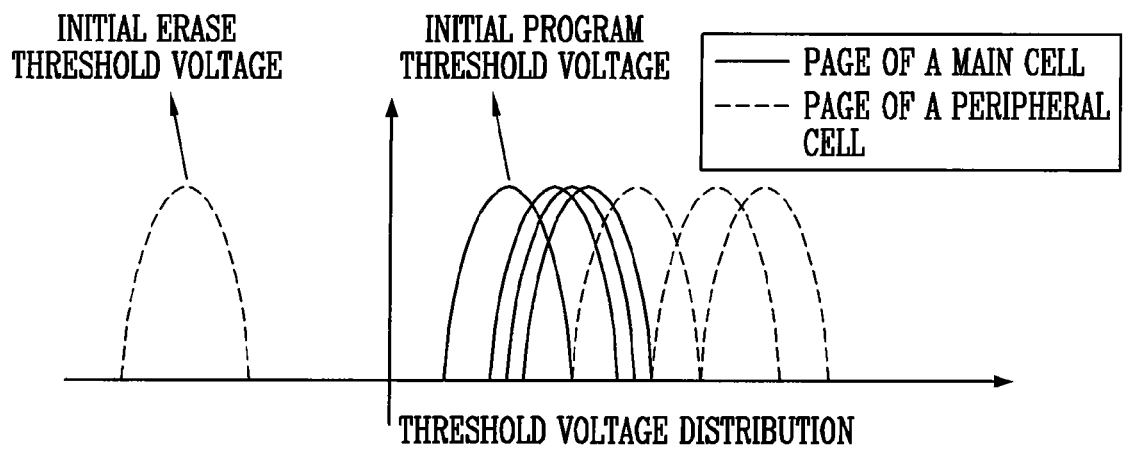
FIG. 3 is a view illustrating a waveform of the initial erase threshold voltage of the peripheral cell that is predicted using the measured program threshold voltage of the peripheral cell and the measured program threshold voltage of the main cell.

FIG. 3 is a view illustrating a waveform of the initial erase threshold voltage of the peripheral cell that is predicted using the measured program threshold voltage of the peripheral cell and the measured program threshold voltage of the main cell.

FIG. 3 shows the program threshold voltage of each of the peripheral cells and the program threshold voltage of the main cell measured in FIG. 1 as a waveform similar to FIG. 2. Since the program threshold voltage of one page of the main cell related to the program threshold voltage of each of the peripheral cells is illustrated, the initial erase threshold voltage of the peripheral cell may be predicted.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of monitoring an erase threshold voltage distribution in a NAND flash memory device, the method comprising:
    erasing a memory block;
    measuring a threshold voltage of a main cell by applying a first program voltage to the main cell;
    measuring a threshold voltage of the main cell changed by applying a second program voltage to a peripheral cell and a threshold voltage of the peripheral cell;
    measuring a threshold voltage of the main cell and a threshold voltage of the peripheral cell by applying a third program voltage to the peripheral cell;
    calculating an interference correlation between the second and third program voltages and the threshold voltages; and
    obtaining an erase distribution of the main cell and the peripheral cell using the interference correlation.

2. The method of claim 1, wherein the first program voltage applied to a page of the peripheral cell has a value between approximately 15V and approximately 20V.

3. The method of claim 1, further comprising:
    changing the second and third program voltages before calculating the interference correlation, and then measuring repeatedly threshold voltages of the main cell and the peripheral cell using the changed program voltages.

4. The method of claim 3, wherein the threshold voltages of the main cell and the peripheral cell are repeatedly measured after changing two times or three times the program voltage.

5. The method of claim 1, wherein the interference correlation is expressed as $Y=aX+b$.

6. The method of claim 5, wherein X is an erase threshold voltage value of the peripheral cell,
    a is an interference coupling ratio,
    b is a threshold voltage of the main cell measured after the program operation is performed by using the first program voltage, and
    Y is a threshold voltage of the main cell changed by interference in accordance with the threshold voltage value of each of measured peripheral cells.

7. The method of claim 6, wherein the erase distribution is expressed as $X'=(Y'-b)/a$.

8. The method of claim 7, wherein X' is the erase threshold voltage value of the peripheral cell, and
    Y' is the changed threshold voltage value of the main cell.

9. The method of claim 1, wherein the peripheral cell is adjacent to the main cell in a direction of a bit line or a direction of a word line.

10. A method of monitoring an erase threshold voltage distribution in a NAND flash memory device, the method comprising:
    programming a main cell using a first program voltage;
    measuring a first threshold voltage value of the main cell;
    programming a peripheral cell by applying a second program voltage to the peripheral cell next to the main cell;
    measuring a second threshold voltage value of the main cell changed by a first threshold voltage of the peripheral cell and an interference effect;
    programming the peripheral cell by applying a third program voltage to the peripheral cell;
    measuring a third threshold voltage of the main cell changed by a second threshold voltage of the peripheral cell and an interference effect;
    calculating an interference correlation between the second and third program voltages and the threshold voltages of the main cell and the peripheral cell; and
    obtaining an erase distribution of the main cell and the peripheral cell using the interference correlation.

11. The method of claim 10, wherein the interference correlation is expressed as $Y=aX+b$.

12. The method of claim 11, wherein X is an erase threshold voltage value of the peripheral cell,
    a is an interference coupling ratio,
    b is a threshold voltage of the main cell measured after the program operation is performed by using the first program voltage, and
    Y is a threshold voltage of the main cell changed by interference in accordance with the threshold voltage value of each of measured peripheral cells.

13. The method of claim 10, wherein the erase distribution is expressed as $X'=(Y'-b)/a$.

14. The method of claim 13, wherein X' is the erase threshold voltage value of the peripheral cell,
    Y' is the second threshold voltage value or the third threshold voltage value of the main cell.

* * * * *